(12) United States Patent
Nishiuchi et al.

(10) Patent No.: US 6,861,089 B2
(45) Date of Patent: Mar. 1, 2005

(54) METHOD OF INHIBITING PRODUCTION OF PROJECTIONS IN METAL DEPOSITED-FILM

(75) Inventors: Takeshi Nishiuchi, Osaka (JP); Fumiaki Kikui, Osaka (JP); Yoshimi Tochishita, Hyogo (JP)

(73) Assignee: Neomax Co. Ltd., Osaka (JP)

( * ) Notice: Subject to any disclaimer, the term of this patent is extended or adjusted under 35 U.S.C. 154(b) by 0 days.

(21) Appl. No.: 10/311,353

(22) PCT Filed: Jul. 6, 2001

(86) PCT No.: PCT/JP01/05900
§ 371 (c)(1),
(2), (4) Date: Jan. 7, 2003

(87) PCT Pub. No.: WO02/08483
PCT Pub. Date: Jan. 31, 2002

(65) Prior Publication Data
US 2003/0108673 A1 Jun. 12, 2003

(30) Foreign Application Priority Data
Jul. 10, 2000 (JP) .................................... 2000-207625

(51) Int. Cl.[7] ............................................. C23C 14/50
(52) U.S. Cl. ..................... 427/127; 427/528; 427/531; 427/250; 427/251; 427/255.5; 204/192.2
(58) Field of Search ................. 427/528, 531, 427/250, 251, 255.5, 127; 204/192.2

(56) References Cited

U.S. PATENT DOCUMENTS

| | | | |
|---|---|---|---|
| 3,517,644 A | * 6/1970 | Baer | 118/716 |
| 4,116,161 A | 9/1978 | Steube | 118/49.1 |
| 4,604,291 A | 8/1986 | Huang et al. | |
| 4,770,723 A | 9/1988 | Sagawa et al. | 148/302 |
| 4,792,368 A | 12/1988 | Sagawa et al. | 148/302 |

FOREIGN PATENT DOCUMENTS

| | | | |
|---|---|---|---|
| EP | 0 991 085 A1 | 4/2000 | |
| EP | 992605 A2 * | 4/2000 | C23C/14/24 |
| EP | 1055744 A2 * | 11/2000 | C23C/14/24 |
| EP | 1 136 587 A2 | 9/2001 | |
| JP | 62-60212 | 3/1987 | |

OTHER PUBLICATIONS

Graham Legge; "Ion Vapor Deposited Coating for Improved Corrosion Protection"; Industrial Heating; pp 135–140; Sep. 1994.

Chinese Office Action with English translation dated May 28, 2004.

* cited by examiner

Primary Examiner—Timothy Meeks
(74) Attorney, Agent, or Firm—Armstrong, Kratz, Quintos, Hanson & Brooks, LLP

(57) ABSTRACT

A method of inhibiting production of projections in a metal deposited-film according to the present invention is characterized by using a vapor deposition apparatus comprising, in a vacuum-treating chamber, an evaporating section for a depositing material, and an accommodating member and/or a holding member for accommodation and/or hold of work pieces, respectively, and, in depositing a metal depositing material on each of the surface of the work pieces with the accommodating member and/or the holding member being made rotated about the horizontal rotational axis thereof, carrying out vapor deposition with a Vickers hardness of a film formed on each of the surface of the work pieces maintained at 25 or more. According to the present invention, production of projections in a metal deposited-film can be effectively inhibited when forming the metal deposited-film of aluminum, zinc or the like on the surface of a work piece such as a rare earth metal-based permanent magnet.

6 Claims, 4 Drawing Sheets

METHOD OF INHIBITING PRODUCTION OF PROJECTIONS IN METAL DEPOSITED-FILM

TECHNICAL FIELD

The present invention relates to a method of inhibiting production of projections in a metal deposited-film when forming the metal deposited-film of aluminum, zinc or the like on the surface of a work piece such as a rare earth metal-based permanent magnet.

BACKGROUND OF THE INVENTION

A rare earth metal-based permanent magnet such as an R—Fe—B based permanent magnet, of which an Nd—Fe—B based permanent magnet is representative, is used at present in a variety of fields, because it has a high magnetic characteristic.

However, the rare earth metal-based permanent magnet contains metal species (in particular, R) liable to be corroded by oxidation in the atmosphere. Therefore, when the rare earth metal-based permanent magnet is used without being subjected to a surface treatment, the corrosion of the magnet is advanced from its surface due to the influence of a small amount of acid, alkali and/or water to produce rust, thereby bringing about the deterioration and dispersion of the magnetic characteristic. Further, when the magnet having the rust produced therein is incorporated into a device such as a magnetic circuit, there is a possibility that the rust is scattered to pollute surrounding parts or components.

With the foregoing in view, it is a conventional practice to form a metal deposited-film of aluminum, zinc or the like on the surface of a rare earth metal-based permanent magnet for the purpose of providing an excellent corrosion resistance to the rare earth metal-based permanent magnet.

In particular, an aluminum film is, in addition to being excellent in corrosion resistance and mass productivity, excellent in reliability of adhesion with an adhesive required in assembling parts (a peel-off is difficult to occur between the film and the adhesive before reaching an intrinsic fracture strength of the adhesive). Thus, the aluminum film is widely applied to rare earth metal-based permanent magnets for which strong adhesive strength is required. As the adhesive here, in compliance with purposes of being heat resistant, impact resistant and the like, there are selected and used various kinds of adhesives as appropriate. They are various kinds of resin adhesives such as those of epoxy resin, phenol resin, reactive acrylic resin, modified acrylic resin (ultraviolet curing adhesives and anaerobic adhesives), cyanoacrylate resin, silicone resin, polyisocyanate, vinyl acetate resin, methacrylate resin, polyamide, and polyether, emulsion adhesives of various kinds of resin adhesives (for example, vinyl acetate resin adhesives, acrylic resin adhesives and the like), various kinds of rubber adhesives (for example, nitrite rubber adhesives, polyurethane rubber adhesives and the like), and ceramic adhesives.

Examples of apparatus used for forming a metal deposited-film on the surface of a rare earth metal-based permanent magnet, include an apparatus described in U.S. Pat. No. 4,116,161 and an apparatus described in Graham Legge, "Ion Vapor Deposited Coatings for Improved Corrosion Protection": Reprinted from Industrial Heating, September, 135–140, 1994. FIG. 1 is a diagrammatic front view (a partially perspective view) of the inside of a vacuum-treating chamber 1 connected to an evacuating system (not shown) in one example of such apparatus. Two cylindrical barrels 5, for example, formed of a mesh net of a stainless steel are disposed side-by-side in an upper area in the chamber for rotation about a rotary shaft 6 on a horizontal rotational axis. A plurality of boats 2, which are evaporating sections for evaporating, for example, aluminum as a metal depositing material, are disposed on a boat support base 4 risen on a support table 3 in a lower area in the chamber.

With this apparatus, a plurality of rare earth metal-based permanent magnets 30 as work pieces are placed into each of the cylindrical barrels 5, and aluminum is evaporated from the boats 2 heated to a predetermined temperature by a heating means (not shown), while rotating the cylindrical barrels about the rotary shaft 6, as shown by an arrow, thereby forming a deposited-film of aluminum on the surface of each of the rare earth metal-based permanent magnets 30 in the cylindrical barrels 5.

The vapor deposition apparatus shown in FIG. 1 is capable of treating a large amount of the work pieces and excellent in productivity. However, projections might have been produced in some cases on the metal deposited-film formed on the surface of each of the rare earth metal-based permanent magnets.

Presence of such projections in the film adversely affects adhesion of the magnets when assembling the magnets onto parts by using adhesive. In particular, for the projections exceeding a mean line of roughness curves (phase correct filtered mean line) according to JIS B0601-1994 by 100 $\mu$m or more, the adhesive has to be applied with a considerably large thickness so as to avoid the influence of the presence of the projections for ensuring sufficient adhesion. Therefore, use of an adhesive with low viscosity can not ensure to provide such a thickness with resulting insufficient adhesion. Moreover, use of an adhesive such as a cyanoacrylate adhesive that is cured through a chemical reaction with the surface of the film provides insufficient curing, which results in obtaining insufficient adhesion. Furthermore, even in the case where no adhesive is used as in an interior permanent magnet (IPM) type motor, presence of the projections prevents parts from being provided with high dimensional accuracy with resulting difficulty in complying with recent requirements of the parts for being reduced in size and provided with high-accuracy.

Accordingly, it is an object of the present invention to provide a method of effectively inhibiting production of projections in a metal deposited-film of aluminum, zinc or the like when forming the metal deposited-film on the surface of a work piece such as a rare earth metal-based permanent magnet.

DISCLOSURE OF THE INVENTION

The inventors have carried out detailed studies with analyses about why and how the projections are produced in the metal deposited-film and, as a result, have found the following facts. Namely, in the vapor deposition apparatus as shown in FIG. 1, the rotation of the cylindrical barrel in thus constituted apparatus causes in the barrel such phenomena as collisions and rubbings of the rare earth metal-based magnets accommodated in the barrel against one another. Moreover, there are caused phenomena of collisions and rubbings between the magnets and the barrel wall. This damages the metal deposited-film formed on each of the magnets to be partially shaved off. The shaved off fragments further rub against the magnets and the like to be granulated and adhere on other film portions, on which films are further formed. Thus, projections are produced which can not be removed by such peening work (cf. JP-A-62-60212) as to be usually carried out after film formation with a purpose of improving corrosion resistance of the film. Furthermore, the magnets are always in a state of being heated by a radiant heat from the evaporating section. Thus, the metal deposited-film formed on the surface of each of the magnets has been softened by a rise in temperature more than necessary to be easily damaged.

The present invention has been accomplished on the basis of the above findings, and a method of inhibiting production of projections in a metal deposited-film according to the present invention is characterized by using a vapor deposition apparatus comprising, in a vacuum-treating chamber, an evaporating section for a depositing material, and an accommodating member and/or a holding member for accommodation and/or hold of work pieces, respectively, and, in depositing a metal depositing material on each of the surface of the work pieces with the accommodating member and/or the holding member being made rotated about the horizontal rotational axis thereof, carrying out vapor deposition with a Vickers hardness of a film formed on each of the surface of the work pieces maintained at 25 or more.

According to the principles of the present invention, a method is characterized in that a temperature of each of the work pieces accommodated and/or held in the accommodating member and/or the holding member, respectively, is maintained at ⅔ or less a melting point in bulk (Tm) (° C.) of the metal depositing material to thereby maintain the Vickers hardness of the film formed on each of the surface of the work pieces at 25 or more.

According to the principles of the present invention, a method is characterized in that the metal depositing material is aluminium, with which vapor deposition is carried out with a temperature of the work piece maintained at 350° C. or less.

According to the principles of the present invention, a method is characterized in that the metal depositing material is zinc, with which vapor deposition is carried out with a temperature of the work piece maintained at 250° C. or less.

According to the principles of the present invention, a method is characterized in that the vapor deposition is carried out by a vacuum evaporation process or an ion plating process.

According to the principles of the present invention, a method is characterized in that the accommodating member and/or the holding member are/is detachably constituted.

According to the principles of the present invention, a method is characterized in that the accommodating member is a tubular barrel formed of a mesh net.

According to the principles of the present invention, a method is characterized in that the tubular barrel is revolvably supported circumferentially outside a horizontal rotational axis of a support member made rotatable about the rotational axis, for revolution about the rotational axis of the support member by rotating the support member.

According to the principles of the present invention, a method is characterized in that the tubular barrel and/or the support member supporting the tubular barrel are/is detachably constituted.

According to the principles of the present invention, a method is characterized in that a plurality of the tubular barrels are supported in an annular shape circumferentially outside the rotational axis of the support member.

According to the principles of the present invention, a method is characterized in that the inside of the tubular barrel is divided to form two or more accommodating sections.

According to the principles of the present invention, a method is characterized in that the inside of the tubular barrel is divided radially from a rotational axis to form two or more accommodating sections.

According to the principles of the present invention, a method is characterized in that the work piece is a rare earth metal-based permanent magnet.

In addition, a rare earth metal-based permanent magnet according to the present invention characterized by having a metal deposited-film in which production of projections is inhibited by the method according to the principles of the present invention.

According to the principles of the present invention, a rare earth metal-based permanent magnet is characterized in that a height of the projection exists in the metal deposited-film is above a mean line of roughness curves (phase correct filtered mean line) according to JIS B0601-1994 by 100 μm or less.

BEST MODE FOR CARRYING OUT THE INVENTION

Figure 1:
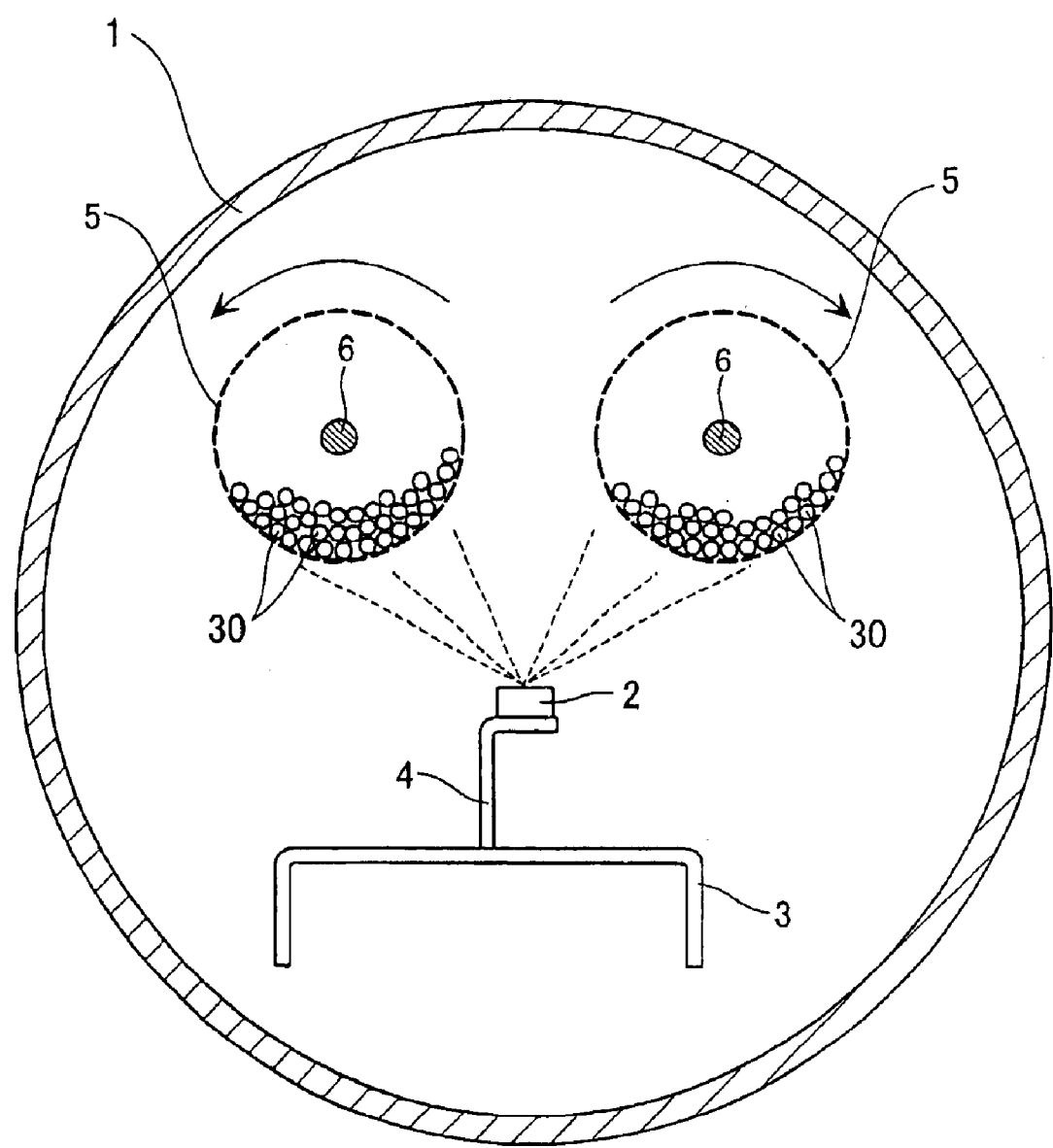
FIG. 1 is a diagrammatic front view (a partially perspective view) of the inside of a vacuum-treating chamber in one example of a vapor deposition apparatus applied to the present invention.

A method of inhibiting production of projections in a metal deposited-film according to the present invention is characterized by using a vapor deposition apparatus comprising, in a vacuum-treating chamber, an evaporating section for a depositing material, and an accommodating member and/or a holding member for accommodation and/or hold of work pieces, respectively, and, in depositing a metal depositing material on each of the surface of the work pieces with the accommodating member and/or the holding member being made rotated about the horizontal rotational axis thereof, carrying out vapor deposition with a Vickers hardness of a film formed on each of the surface of the work pieces maintained at 25 or more.

Namely, the present invention is based on the following finding. According to the finding, vapor deposition, carried out while suppressing a more than necessary temperature rise of the work pieces, allows a Vickers hardness of a film formed on each of the surface of the work pieces to be maintained at 25 or more. This inhibits the film from being softened to become damageable by collisions and rubbings of the work pieces against one another and by collisions and rubbings between the work pieces and the barrel wall. As a result, production of projections in the film can be effectively inhibited.

The work pieces each being as a target of forming the metal deposited-film in the present invention are not necessarily limited to particular ones if the metal deposited-film can be formed thereon. The present invention, however, particularly exhibits the effect thereof for the rare earth metal-based magnets for which strong adhesive strength to an adhesive is required when assembled onto parts because of the strong magnetic force thereof.

Metal depositing material utilized in the present invention is not limited to particular one. The present invention, however, exhibits the effect thereof when particularly applied to aluminum, zinc, tin, lead, bismuth, or an alloy containing at least one of these metal components. Each of them has a low melting point such that the deposited-film is liable to soften by a temperature rise of the work piece.

In the present invention, in order to carry out vapor deposition with a Vickers hardness of a film formed on each of the surface of the work pieces maintained at 25 or more, it is necessary only that the vapor deposition is carried out with the temperature of each of the work pieces accommodated or held in the accommodating member or the holding member, respectively, being maintained at $2/3$ or less a melting point in bulk (Tm) (° C.) of the metal depositing material. The melting points in bulk of the above metal depositing materials are 660° C., 420° C., 232° C., 328° C., and 271° C. for aluminum, zinc, tin, lead, and bismuth, respectively. In an alloy, when there exists a coexistence state of two phases of a solid phase and a liquid phase at a high temperature, a temperature corresponding to a composition on a solid us is taken as a melting point. When the work piece is a rare earth metal-based permanent magnet, aluminum or zinc is preferable as the metal depositing material with consideration of cost. In using aluminum, vapor deposition is well carried out with a temperature of the magnet maintained at $2/3$ or less a melting point in bulk of aluminum, namely, 440° C. or less. It is, however, preferable to carry out the vapor deposition with the temperature maintained at 350° C. or less, and more preferable to carry out the vapor deposition with the temperature maintained at 300° C. or less. When zinc is used, vapor deposition is well carried out with a temperature of the magnet maintained at $2/3$ or less a melting point in bulk of zinc, namely, 280° C. or less. It is, however, preferable to carry out the vapor deposition with the temperature maintained at 250° C. or less.

A lower limit of the temperature of the work piece is, for the work piece being the rare earth metal-based permanent magnet, generally taken as being at 100° C. This is because a vapor deposition carried out at a temperature lower than 100° C. provides a possibility of achieving no sufficient adhesion between the magnet and the metal deposited-film.

The method of inhibiting production of projections in a metal deposited-film according to the present invention is suitably applied to vapor deposition processes such as a vacuum evaporation process, an ion plating process, a beam process, and a CVD process. Namely, in each of such processes, the temperature of the work piece might have risen more than necessary at the vapor deposition to cause resulting production of projections in the film. Of these processes, a vapor deposition process with a resistance heating system as is adopted in the vacuum evaporation process or the ion plating process, particularly a vapor deposition process with a system of continuously supplying depositing material to an electrically heated evaporating section to melt it, can carry out deposition with a high deposition rate and is useful for treating a large amount of the work pieces. Therefore, by applying the method of inhibiting production of projections in a metal deposited-film according to the present invention to such a vapor deposition process, an effect is exhibited with which a film with excellent quality can be formed on each of the surface of the work pieces efficiently as well as stably.

A vapor deposition apparatus applied to the present invention is an apparatus which comprises, in a vacuum-treating chamber, an evaporating section for a depositing material and an accommodating member for accommodation of work pieces, and can deposit a depositing material on each of the surface of the work pieces with the accommodating member being made rotated about the horizontal rotational axis thereof. As an example of such an apparatus, there can be presented the following ones.

For example, there is presented a vapor deposition apparatus as shown in the above FIG. 1. In using such an apparatus, for a method of carrying out the vapor deposition with a Vickers hardness of a film formed on each of the surface of the work pieces maintained at 25 or more, there is a method of completing the vapor deposition before a temperature of each of the accommodated work pieces reaches $2/3$ a melting point in bulk (Tm)(° C.) of the metal depositing material, a method of temporarily discontinuing the vapor deposition before the temperature reaches $2/3$ the melting point, cooling the work pieces before resuming the vapor deposition and repeating the process, a method of maintaining the temperature of each of the work pieces below $2/3$ the melting point by introducing into a cylindrical barrel a cooling mechanism using cooling water, cooling gas or the like, a method of disposing a shielding plate for reducing a radiant heat from the evaporating section, or the like.

Figure 2:
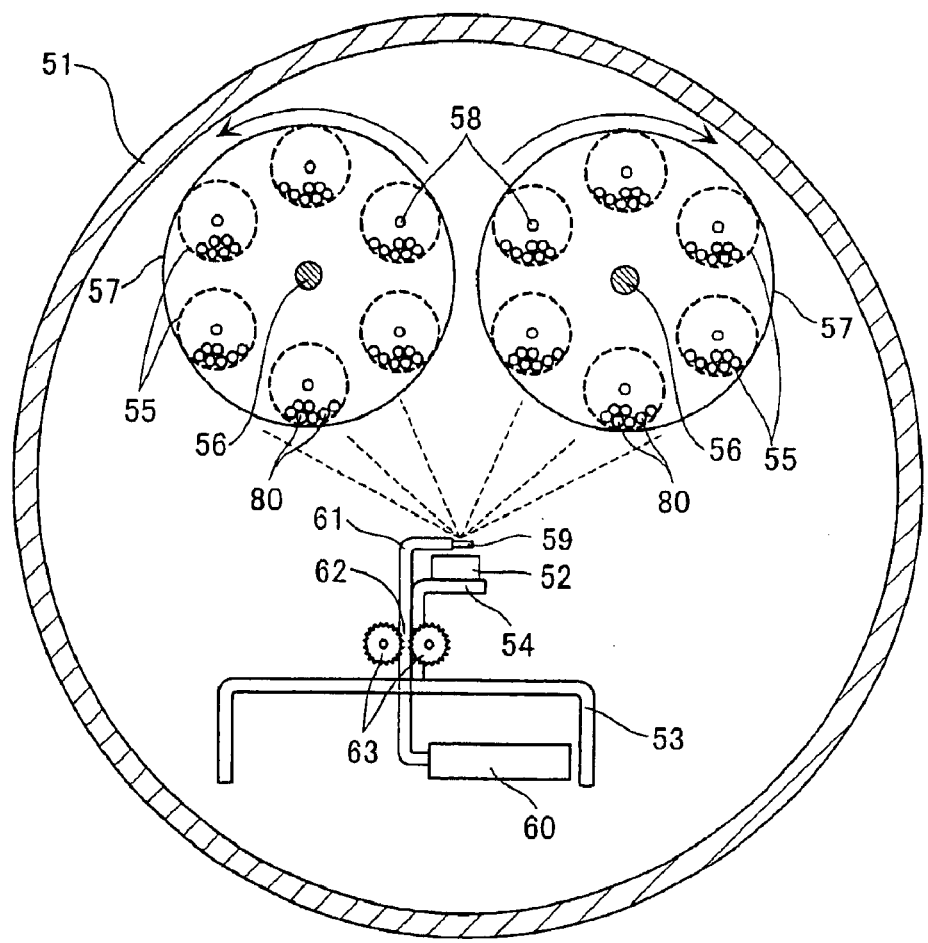
FIG. 2 is a diagrammatic front view (a partially perspective view) of the inside of a vacuum-treating chamber in another example of a vapor deposition apparatus applied to the present invention.

In addition, the use of the vapor deposition apparatus as shown in FIG. 2 can effectively suppress more than necessary temperature rise of the work pieces to allow the vapor deposition to be easily carried out with a Vickers hardness of a film formed on each of the surface of the work pieces maintained at 25 or more.

FIG. 2 is a diagrammatic front view (a partially perspective view) of the inside of a vacuum-treating chamber 51 connected to an evacuating system not shown (description will be made with an apparatus for forming a deposited-film of aluminum on the surface of each of rare earth metal-based permanent magnets taken as an example).

In an upper area in the chamber, two support members 57 made rotatable about a rotary shaft 56 on a horizontal rotational axis are disposed side-by-side. Circumferentially outside the rotary shaft 56 of the support member 57, six cylindrical barrels 55 formed of, for example, a mesh net of a stainless steel are supported in an annular shape by support shafts 58 revolvably about the rotary shaft 56. In a lower area in the chamber, a plurality of boats 52, which are evaporating sections for evaporating a metal depositing material, are disposed on a boat support base 54 risen on a support table 53.

Inside below the support table 53, an aluminum wire 59, which is a metal depositing material, is retained and wound around a feed reel 60. A proceeding end of the aluminum wire 59 is guided to above the boat 52 by a thermal resistant protective tube 61 made to face toward an inner surface of the boat 52. A cut out window 62 is provided in a portion of the protective tube 61, and feeding gears 63 are mounted in correspondence to the cut out window 62 to come into direct contact with the aluminum wire 59. Thus, a constitution is provided so that aluminum is constantly supplied into the boat 52 by feeding the aluminum wire 59.

Figure 3:
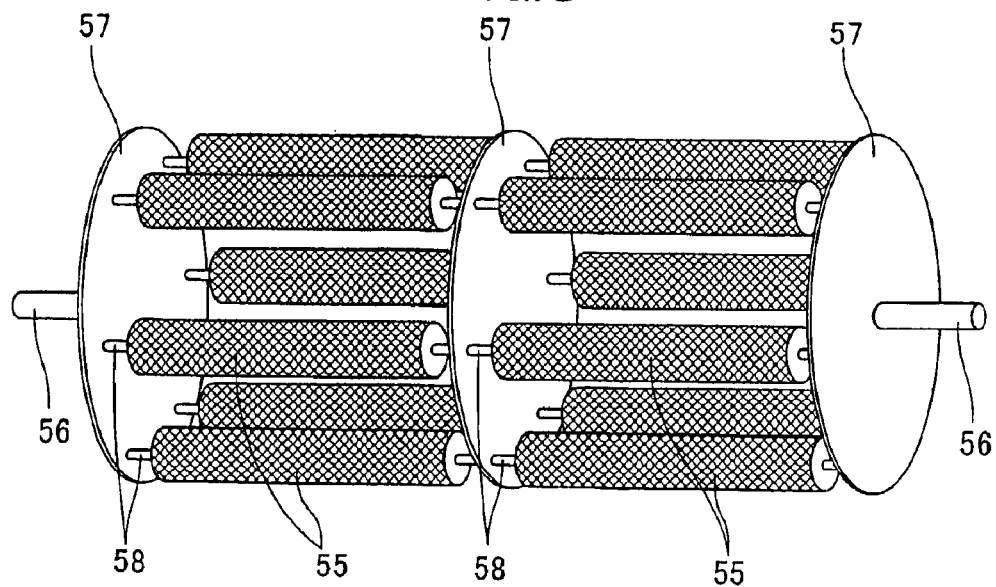
FIG. 3 is a diagrammatic perspective view of cylindrical barrels supported on support members thereof.

FIG. 3 is a diagrammatic perspective view showing that the six cylindrical barrels 55, each formed of the mesh net of the stainless steel, are supported revolvably in the annular shape by the support shaft 58 circumferentially outside the rotary shaft 56 of the support member 57 that is made rotatable about the rotary shaft 56 on the horizontal rotational axis (the cylindrical barrels are supported in tandem and hence, the total number of the cylindrical barrels supported is twelve) (magnets are not accommodated yet).

When the support member 57 is rotated about the rotary shaft 56 (see an arrow in FIG. 2), the cylindrical barrel 55 supported by the support shaft 58 circumferentially outside the rotary shaft 56 of the support member 57 is made revolve about the rotary shaft 56 in response to the rotation of the support member 57. As a result, the distance between the individual barrel and the evaporating section disposed below the support member is to be Varied, whereby the following effect is exhibited.

Namely, the cylindrical barrel located at a lower portion of the support member 57 is close to the evaporating section. Therefore, a metal deposited-film is efficiently formed on a surface of each of rare earth metal-based permanent magnets 80 accommodated in this cylindrical barrel. On the other hand, a temperature rise in each of rare earth metal-based permanent magnets accommodated in the cylindrical barrel moved away from the evaporating section is reduced by an amount corresponding to a distance away from the evaporating section. Therefore, during this time, the softening of a metal deposited-film is inhibited which is formed on a surface of each of the magnets. In this way, the use of this vapor deposition apparatus makes it possible to simultaneously achieve the efficient formation of the metal deposited-film and the inhibition of the softening of the formed metal deposited-film, which can effectively inhibit production of projections.

The vapor deposition apparatus is convenient in that it exhibits the above-described effect and, along with this, has following advantages.

Namely, even when a mass treatment is carried out, a treatment in this vapor deposition apparatus, carried out with a small amount of magnets accommodated in each of the cylindrical barrels, can reduce the frequency of collision and rubbing of the magnets against one another within the barrel rather than the treatment with a larger amount of magnets accommodated in a single cylindrical barrel as in the vapor deposition apparatus shown in FIG. 1. Hence, it becomes possible to further inhibit the production of projections caused by damaged films.

When accommodated in a cylindrical barrel having a large R (radius of curvature) in the vapor deposition apparatus as shown in FIG. 1 for vapor deposition treatment, magnets like bow-shaped or large-sized ones slip down along the inner surface of the barrel and are liable to damage the films due to rubbing against the inner surface of the barrel. Even for such magnets, by accommodating them in each of the cylindrical barrels having a smaller radius R in this vapor deposition apparatus for vapor deposition treatment, it becomes possible to stir the magnets uniformly to permit further inhibiting production of projections due to damaged films.

Previously, for the purpose of the reduction of the frequency of collision and that of rubbing of the magnets against one another within the barrel, a method of using dummies (e.g., there are presented ceramic balls having a diameter of 10 mm), which were sometimes accommodated in the barrel along with magnets, was adopted in some cases. However, the use of this vapor deposition apparatus eliminates the need for using the dummies to make it possible to enhance the efficiency of the formation of films on the magnets. This facilitates the vapor deposition to be completed before the temperature of the magnets reaches ⅔ the melting point in bulk (Tm)(° C.) of the metal depositing material.

In the vapor deposition apparatus shown in FIG. 2 and FIG. 3, the support member 57 for supporting the cylindrical barrel 55 is disposed in the upper area in the vacuum-treating chamber 51. The boat 52, which is the evaporating section, is disposed in the lower area in the chamber 51. Nevertheless, the positional relationship between the support member and the evaporating section is not limited to the above relationship. The support member and the evaporating section may be disposed at any locations in the vacuum-treating chamber if they are in a positional relationship ensuring that the distance between the cylindrical barrel and the evaporating section can be varied by rotating the support member. However, the evaporating section being disposed outside the support member allows the distance between the support member and the evaporating section to be set in a wide range within the internal space in the vacuum-treating chamber. Therefore, it becomes possible to easily set a distance desirable for efficiently forming a metal deposited-film and inhibiting the softening of the formed film. In addition, even when a deposited-film is formed while the metal depositing material being molten and evaporated, arrangement of each of the members or components can be easily determined for becoming excellent also in handling.

In addition, in the vapor deposition apparatus shown in FIG. 2 and FIG. 3, the six cylindrical barrels 55 are supported on one surface of one of the support members 57 (the cylindrical barrels are supported in tandem and hence, the total number of the cylindrical barrels supported is twelve). However, the number of the cylindrical barrels supported on one of the support members is not limited to six and may be one.

The cylindrical barrel 55 may be supported so that it revolves about the rotary shaft 56 of the support member 57 and, along with this, rotates itself about the support shaft 58 by a known mechanism.

Figure 4:
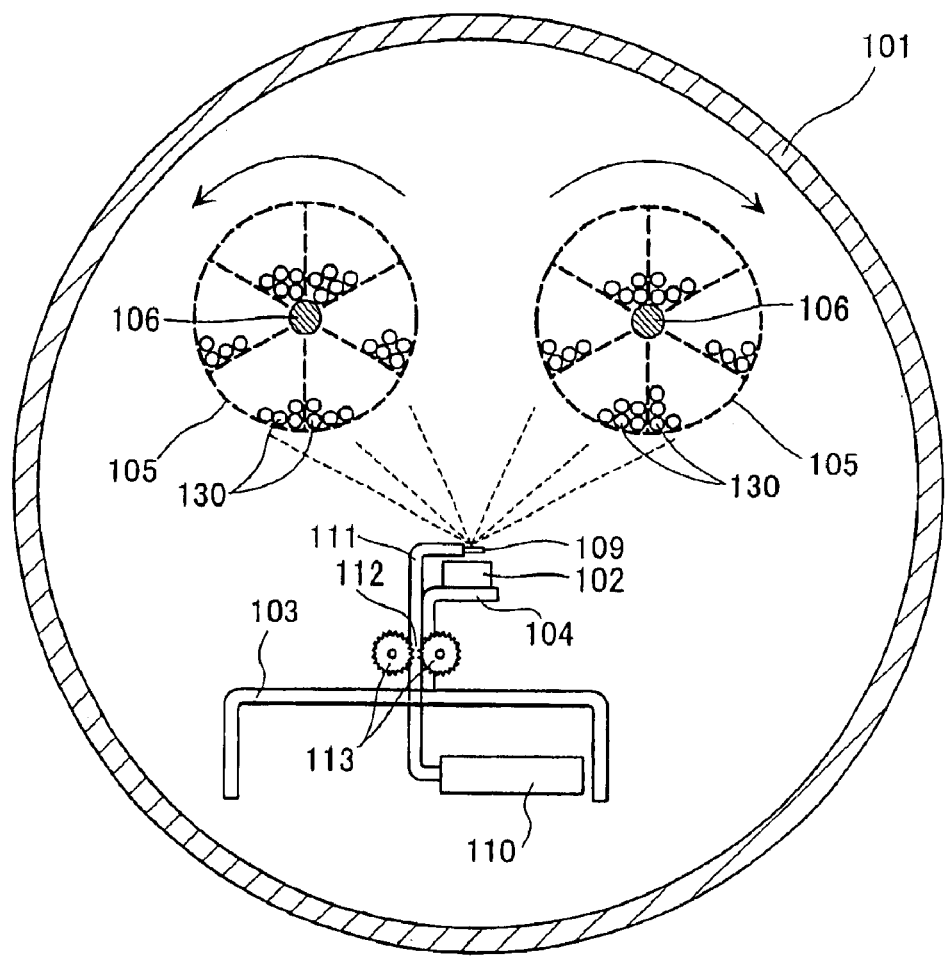
FIG. 4 is a diagrammatic front view (a partially perspective view) of the inside of a vacuum-treating chamber in further another example of a vapor deposition apparatus applied to the present invention.

In addition, also the use of the vapor deposition apparatus as shown in FIG. 4 can effectively suppress more than necessary temperature rise of the work pieces to allow the vapor deposition to be easily carried out with a Vickers hardness of a film formed on each of the surface of the work pieces maintained at 25 or more.

FIG. 4 is a diagrammatic front view (a partially perspective view) of the inside of a vacuum-treating chamber 101 connected to an evacuating system not shown (description will be made with an apparatus for forming a deposited-film of aluminum on the surface of each of rare earth metal-based permanent magnets taken as an example).

In an upper area in the chamber, there are disposed side-by-side two cylindrical barrels 105 formed of, for example, a mesh net of a stainless steel and made rotatable about a rotary shaft 106 on a horizontal rotational axis. The inside of the cylindrical barrel 105 is divided radially from a rotational axis into six to form accommodating sections each being sector-shaped in section. In a lower area in the chamber, a plurality of boats 102, which are evaporating sections for evaporating a metal depositing material, are disposed on a boat support base 104 risen on a support table 103.

Inside below the support table 103, an aluminum wire 109, which is a metal depositing material, is retained and wound around a feed reel 110. A proceeding end of the aluminum wire 109 is guided to above the boat 102 by a thermal resistant protective tube 111 made to face toward an inner surface of the boat 102. A cut out window 112 is provided in a portion of the protective tube 111, and feeding gears 113 are mounted in correspondence to the cut out window 112 to come into direct contact with the aluminum wire 109. Thus, a constitution is provided so that aluminum is constantly supplied into the boat 102 by feeding the aluminum wire 109.

Figure 5:
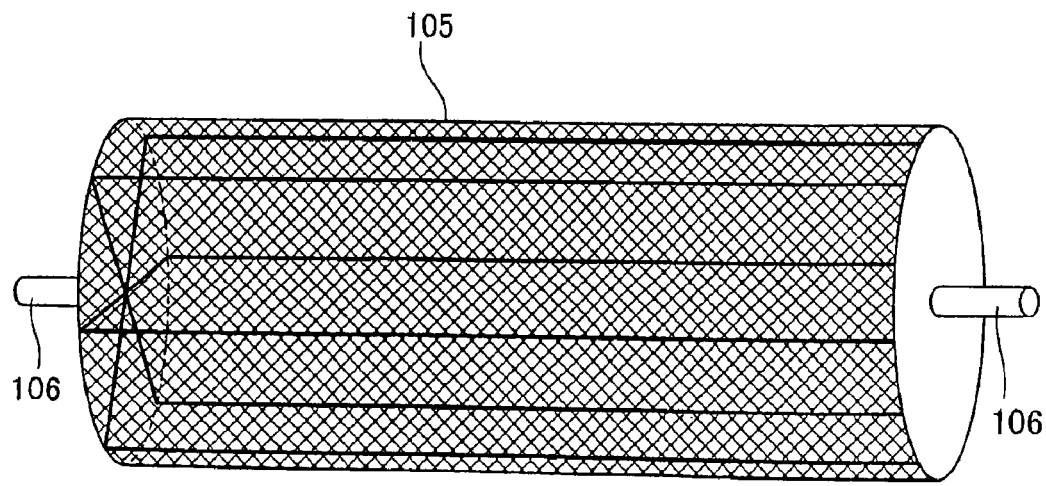
FIG. 5 is a diagrammatic perspective view of the cylindrical barrel whose inside is divided.

FIG. 5 is a diagrammatic perspective view showing the cylindrical barrel 105 formed of the mesh net of the stainless steel, rotatable about the rotary shaft 106 on the horizontal rotational axis, and having the inside divided radially from the rotational axis into six to form the accommodating sections each being sector-shaped in section (magnets are not accommodated yet).

When the cylindrical barrel 105 is rotated about the rotary shaft 106 (see an arrow in FIG. 4), the distance between the individual accommodating section defined in the cylindrical barrel and the evaporating section disposed below the accommodating sections is to be varied. Thus, like in the case where the vapor deposition carried out by using the vapor deposition apparatus shown in FIG. 2 and FIG. 3, production of projections can be effectively inhibited.

In the vapor deposition apparatus shown in FIG. 4 and FIG. 5, in the upper area in the vacuum-treating chamber 101, there is disposed the cylindrical barrel 105 whose inside is divided radially from the rotational axis into six to form the accommodating sections each being sector-shaped in section. In the lower area in the chamber 101, there is disposed the boat 102 which is the evaporating section. However, the positional relationship between the cylindrical barrel and the evaporating section is not limited to the above relationship. The cylindrical barrel and the evaporating section may be disposed at any locations in the vacuum-treating chamber if they are in a positional relationship ensuring that the distance between the accommodating section and the evaporating section can be made freely variable by rotating the cylindrical barrel.

Moreover, in the vapor deposition apparatus shown in FIG. 4 and FIG. 5, the inside of the cylindrical barrel is divided radially from the rotational axis into six to form the accommodating sections each being sector-shaped in section. However, the accommodating sections formed in the cylindrical barrel may be defined by any divided form if the form ensures that the distance between the accommodating section and the evaporating section can be made freely variable by rotating the cylindrical barrel.

The shape of the barrel as an accommodating member in any of the above described vapor deposition apparatuses is not limited to be cylindrical, but may be polygonal-prism-shaped with the section formed in hexagonal, octagonal, or the like, if it is tubular.

As the mesh, there can be presented mesh nets made of stainless steel and titanium. The reason why the stainless steel and titanium are desirable as materials for the mesh net is that the materials are excellent in strength and in durability to etching agents or releasing agents such as alkaline aqueous solutions used in an operation for removing the depositing material deposited on the barrel. The mesh may be made using a net-shaped plate produced by punching or etching a flat plate, or may be made by knitting a linear material.

The open area ratio of the mesh (a ratio of the area of openings to the area of the mesh) depends on the shape and the size of a work piece. For improving an efficiency of forming films onto the work pieces and for easily completing the vapor deposition before the temperature of each of the work pieces reaches ⅔ the melting point in bulk (Tm)(° C.) of the metal depositing material, the ratio is desirably taken as being 50% or more, more desirably as being 60% or more. Although the upper limit of the open area ratio is not particularly limited, for the open area ratio being more than 95%, there is a possibility that the mesh is deformed or damaged in the vapor deposition treatment or in other kinds of handling. Therefore, the ratio is desirably taken as being 95% or less, more desirably as being 85% or less. In addition, the wire diameter of the mesh is selected in consideration of the open area ratio and the strength thereof, and is, in general, desirably in a range of 0.1 mm to 10 mm. Further, with easiness in handling taken into consideration, the wire diameter of the mesh is more desirably in a range of 0.3 mm to 5 mm.

Figure 6:
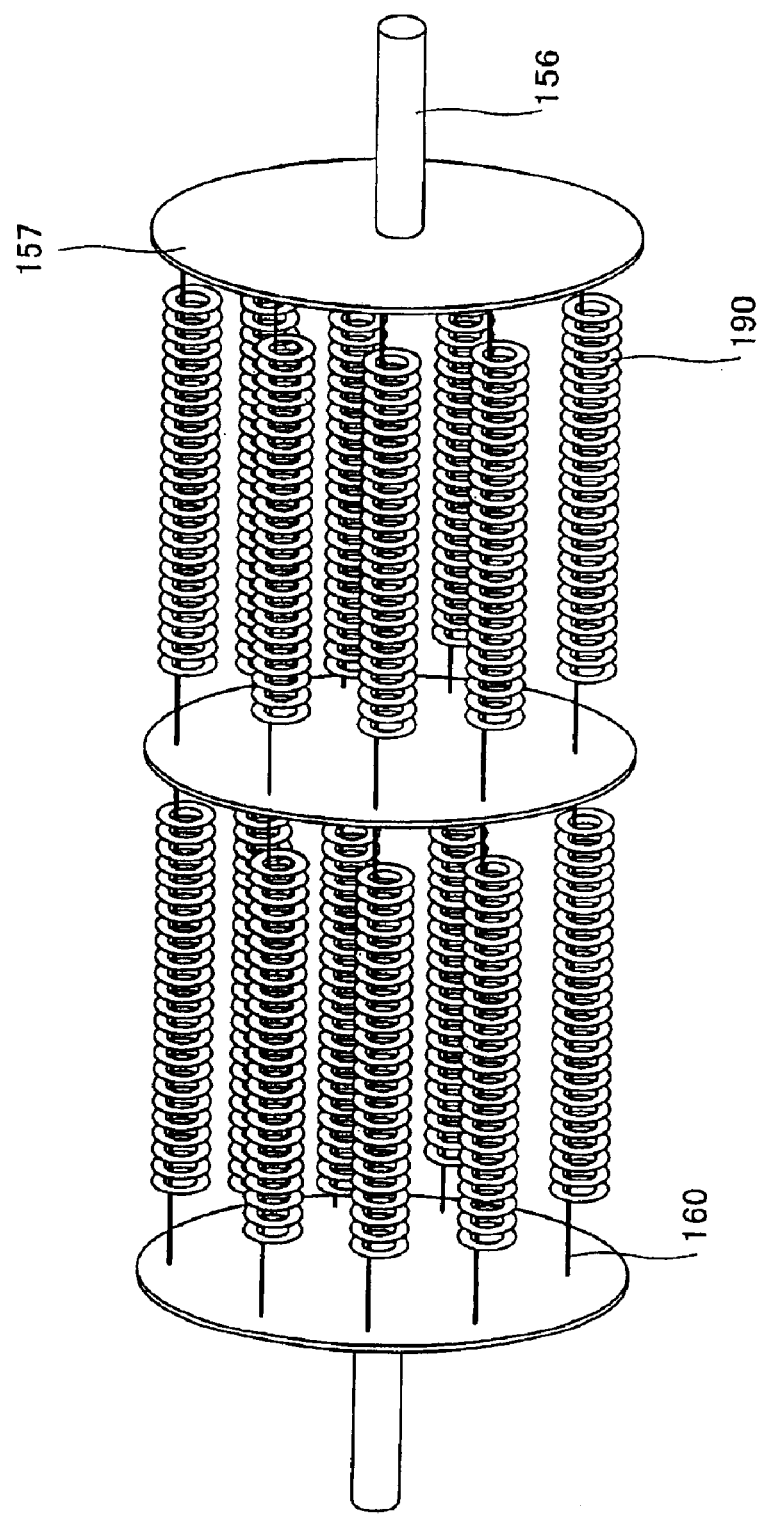
FIG. 6 is a diagrammatic perspective view of a jig used for the further another example of a vapor deposition apparatus applied to the present invention.

The vapor deposition apparatus applied to the present invention is an apparatus which comprises, in a vacuum-treating chamber, an evaporating section for a depositing material and a holding member for hold of work pieces, and can deposit a depositing material on each of the surface of the work pieces with the holding member being made rotated about the horizontal rotational axis thereof. As an example of such an apparatus, there can be presented one in which a jig shown in FIG. 6 is used instead of the cylindrical barrel in the apparatus shown in FIG. 1. Namely, there can be presented an apparatus in which hanger members 160 are revolvably supported circumferentially outside the rotary shaft 156 of the support member 157 that is made rotatable about the rotary shaft 156 on the horizontal rotational axis. The hanger members 160 are provided as holding members for hanging work pieces 190, each with a center opening, such as ring-shaped magnets. By rotating the support member 157, the hanger members 160 are made revolved about the rotary shaft 156 of the support member 157. In carrying out vapor deposition by using such an apparatus, rubbing is caused between a hanger member and an inner peripheral surface as a contacting portion of each work piece hung on the hanger member. This damages the metal deposited-film being formed at the rubbed portion to cause a part of the film to be scraped off. The scraped fragments are further rubbed against the hanger member to be ground to be granulated. The granulated fragments stick onto other part of the film, on which a film is further deposited to cause possible production of unremovable projections. Therefore, also in carrying out vapor deposition with such an apparatus, by carrying out the deposition with a Vickers hardness of a film formed on each of the surface of the work pieces maintained at 25 or more, the effect of the present invention can be obtained.

In a vapor deposition apparatus as described above, to constitute the accommodating member and the holding member as being detachable from the support member or to constitute the support member detachable from the vacuum-treating chamber provides following advantages. Namely, this makes it possible to load and unload the work pieces at any desired place to improve facility of the apparatus. At the completion of one deposition treatment, the accommodating member and the holding member themselves have been usually heated up to a high temperature. When subsequent deposition treatment is carried out with the use of the accommodating member and the holding member as being in the above state, there is a possibility of raising the temperature of the work pieces more than necessary. Therefore, it is desirable to have time for cooling the accommodating member and the holding member. By detachably constituting the accommodating member and the holding member and by preparing a plurality thereof in the same shape, the accommodating member and the holding member used in one deposition treatment can be removed and other ones can be mounted for immediately starting subsequent deposition treatment. Hence, it becomes possible to efficiently carry out a large amount of treatment.

In addition, in the vapor deposition apparatus as above, a treatment is carried out with the inside of the accommodating member longitudinally divided to form two or more accommodating sections, and with one work piece or a small quantity of work pieces accommodated in each accommodated section. This can inhibit occurrence of cracking and breaking of the work pieces caused by collision of the work pieces against one another in the accommodating member. Thus, it becomes possible to effectively inhibit production of projections accompanied by damages of the work pieces.

EXAMPLES

The present invention will be further described in detail by comparison of the following examples with comparative examples. The present invention, however, is not limited to such examples.

The following examples and comparative examples were carried out using sintered magnets with dimensions of 9 mm in diameter by 3 mm in thickness having a composition of $Nd_{14}Fe_{79}B_6Co_1$ (hereinafter referred to as magnet test pieces) which are obtained by pulverizing a known cast ingot and then subjecting the resulting powder to a pressing, a sintering, a heat treatment and a surface working as described in, for example, U.S. Pat. Nos. 4,770,723 and 4,792,368.

Example 1

The following experiment was carried out using the vapor deposition apparatus shown in FIG. 1 (except that the constitution about the evaporating section is the same as that of the vapor deposition apparatus shown in FIG. 2). In the apparatus, the cylindrical barrel was made of a stainless steel with 355 mm in diameter by 1200 mm in length with 64% in open area ratio of a mesh (with each opening being a square of 4 mm in side length and with a wire of 1 mm in diameter).

Each of the magnet test pieces was subjected to a shot blasting, whereby an oxide layer on a surface of each of the magnet test pieces was removed which was produced by a surface working at a preceding step. The magnet test pieces from each of which the oxide layer was removed were accommodated in two cylindrical barrels with 5000 pieces for each, i.e. 10000 pieces in total. After the vacuum-treating chamber was evacuated down to $1\times10^{-3}$ Pa or less, while rotating the rotary shaft at 1.5 rpm, the magnet test pieces were subjected to a spattering for 20 minutes under conditions of an argon (Ar) gas pressure of 1 Pa and a bias voltage of −500 V, whereby the surfaces of the magnet test pieces were cleaned. Subsequently, under conditions of an Ar gas pressure of 1 Pa and a bias voltage of −100 V, an aluminum wire was heated and evaporated as a metal depositing material while being supplied with a wire feeding speed of 3 g/min. The evaporated aluminum was then ionized for forming an aluminum deposited-film on a surface of each of the magnet test pieces by an ion plating process for 20 minutes. After being left for cooling, the magnet test pieces having the aluminum deposited-film were evaluated about the following items.

(1) Temperature of the magnet test pieces at completion of vapor deposition (averaged value for n=10)

(2) Vickers hardness of the aluminum deposited-film at completion of vapor deposition (averaged value for n=3)

(3) Thickness of the formed aluminum deposited-film (averaged value for n=10)

(4) Appearance of each magnet test piece (5) The number of magnet test pieces with one or more projections having been produced with the heights exceeding a mean line of roughness curves (phase correct filtered mean line) according to JIS B0601-1994 by 100 μm or more (the number of defective pieces with projections)(n=500)

(6) The number of rusted magnet test pieces subjected to corrosion-resistance test under a condition of being left for 500 hours under high-temperature and high-humidity conditions at a temperature of 80° C. and a relative humidity of 90% after being subjected to a peening treatment with blast material (glass beads manufactured by Sinto Brator Ltd. under the trade name GB-AG) injected at a injection pressure of 0.2 MPa (the number of rusted defective pieces)(n=10)

(7) Measurement of adhesion strength by measuring compression shear strength of magnet test pieces peening treated under the above conditions which were bonded to a cast-iron jig with a cyanoacrylate resin adhesive (manufactured by Henkel Japan Ltd. under the trade name Loctite 406) before being left for 24 hours (averaged value for n=10)

Measurement of the temperature of the magnet test pieces specified in (1) was separately carried out, rather than being carried out simultaneously with deposition of the deposited-films evaluated according to (2) to (7), under the same conditions as those for the deposition of the deposited-films. Specifically, the following way was adopted in the measurement. Shavings of a plurality of kinds of thermocrayons (manufactured by Nichiyu Giken Kogyo Co., Ltd.) representing respective specified temperatures were wrapped with an aluminum foil into a package. Such a package was attached around each of the magnet test pieces, which were subjected to vapor deposition. Thereafter, it was ascertained how many degrees of temperature correspond to the molten thermocrayon shavings. With respect to the Vickers hardness of the aluminum deposited-film at completion of vapor deposition specified in (2), a QM type high temperature microscopic hardness tester produced by Japan Optical Co., Ltd. was used as a measuring apparatus. The hardness was measured under conditions with a test load of 0.5N and a loading time of 30 sec with the magnet test pieces having aluminum deposited-films obtained by the above method heated up to the temperature at completion of the vapor deposition. Moreover, the number of defective pieces with projections specified in (5) was obtained by observing appearances of the magnet test pieces having aluminum deposited-films obtained by the above method under a magnifier (X10). In the observation, when the presence of projections were made certain, the height about the highest projection was determined by using a scanning confocal laser microscope (OLS 1100 produced by Olympus Optical Co., Ltd.).

The results are shown in Table 1.

Example 2

The following experiment was carried out using the vapor deposition apparatus shown in FIG. 2 and FIG. 3. Here, the cylindrical barrel was made of a stainless steel with 110 mm in diameter by 600 mm in length with 64% in open area ratio of a mesh (with each opening being a square of 4 mm in side length and with a wire of 1 mm in diameter). On one support member, there are supported six thereof (in tandem, twelve in total).

Each of the magnet test pieces was subjected to a shot blasting, whereby an oxide layer on a surface of each of the magnet test pieces was removed which was produced by a surface working at a preceding step. The magnet test pieces from each of which the oxide layer was removed were accommodated in twelve cylindrical barrels with 850 pieces for each, i.e. 20400 pieces in total in two sets in the right and left. After this, an aluminum deposited-film was formed on a surface of each of the magnet test pieces by an ion plating process for 40 minutes in the same way as that in the example 1, and evaluated in the same way as that in the example 1.

The results are shown in Table 1.

Example 3

In the example 1, the magnet test pieces, from each of which the oxide layer was removed, were accommodated in two cylindrical barrels with 5000 pieces for each, i.e. 10000 pieces in total and an aluminum deposited-film of 10 μm in thickness was formed on the surface of each of the magnet test pieces by an ion plating process for 20 minutes. Instead of this, here, the magnet test pieces, from each of which the oxide layer was removed, were accommodated in two cylindrical barrels with 7500 pieces for each, i.e. 15000 pieces in total, an aluminum deposited-film was formed on a surface of each of the magnet test pieces by an ion plating process for 30 minutes (other conditions were the same as those in the example 1), and evaluation thereof was carried out in the same way as that in the example 1.

The results are shown in Table 1.

Example 4

In the example 1, the magnet test pieces, from each of which the oxide layer was removed, were accommodated in two cylindrical barrels with 5000 pieces for each, i.e. 10000 pieces in total and an aluminum deposited-film of 10 μm in thickness was formed on the surface of each of the magnet test pieces by an ion plating process for 20 minutes. Instead of this, here, the magnet test pieces, from each of which the oxide layer was removed, were accommodated in two cylindrical barrels with 10000 pieces for each, i.e. 20000 pieces in total, an aluminum deposited-film was formed on a surface of each of the magnet test pieces by an ion plating process for 40 minutes (other conditions were the same as those in the example 1), and evaluation thereof was carried out in the same way as that in the example 1.

The results are shown in Table 1.

Comparative Example 1

In the example 4, an aluminum deposited-film of 10 μm in thickness was formed on a surface of each of the magnet test pieces by an ion plating process for 40 minutes while an aluminum wire was supplied with a wire feeding speed of 3 g/min. Instead of this, here, an aluminum deposited-film was formed on a surface of each of the magnet test pieces by an ion plating process for 80 minutes while an aluminum wire was supplied with a wire feeding speed of 1.5 g/min (other conditions were the same as those in the example 4), and evaluation thereof was carried out in the same way as that in the example 1.

The results are shown in Table 1.

TABLE 1

|  | Example 1 | Example 2 | Example 3 | Example 4 | Comparative Example 1 |
|---|---|---|---|---|---|
| Magnet temperature (° C.) | 280 | 300 | 330 | 365 | 460 |
| Vickers hardness | 33 | 30 | 28 | 26 | 15 |
| Film thickness (μm) | 10.5 | 9.8 | 11.0 | 10.2 | 11.0 |
| Appearance | Acceptable | Acceptable | A few damages | A few damages | A number of damages |
| Number of defective pieces with projections | 0/500 | 0/500 | 1/500 | 8/500 | 78/500 |
| Number of rusted defective pieces | 0/10 | 0/10 | 0/10 | 1/10 | 5/10 |
| Adhesion strength (MPa) | 12.4 | 13.0 | 12.0 | 11.9 | 3.8* |

*Result of measurement on magnets having projections

As is apparent from Table 1, in example 1 to example 4, by carrying out the vapor deposition with the temperature of each of the magnet test pieces maintained at ⅔ or less the melting point in bulk (Tm)(° C.) of aluminum, namely, 440° C. or less, the Vickers hardness of the film formed on each of the surface of the magnet test pieces could be maintained at 25 or more. This can effectively inhibit production of projections in the film (for example, presence of projections was observed in example 1, but the maximum height thereof was of the order of 30 μm) to also allow an excellent adhesion strength to be obtained between an adhesive. In addition, damage to the film itself was also inhibited to provide the formed film as being excellent in appearance and in corrosion resistance.

On the contrary, in comparative example 1, the film was formed by taking a vapor deposition time twice that in the example 4. Hence, the magnet test pieces were heated more than necessary by the time becoming longer. Thus, the temperature thereof had exceeded 440° C. This made the film formed on the surface of each of the magnet test pieces to have a Vickers hardness reduced down to 25 or less and to be softened to be susceptible to damage. As a result, a number of projections had been produced with the heights thereof exceeding 100 μm. An attempt to bond a magnet test piece with produced projections to a cast-iron jig using an adhesive resulted in insufficient hardening of the adhesive under a normal condition to make it impossible to obtain an excellent adhesion strength. In addition, the film itself was damaged to be unsatisfactory in appearance and corrosion resistance.

Example 5

The following experiment was carried out using the vapor deposition apparatus shown in FIG. 1. In the apparatus, the cylindrical barrel was made of a stainless steel with 355 mm in diameter by 1200 mm in length with 64% in open area ratio of a mesh (with each opening being a square of 4 mm in side length and with a wire of 1 mm in diameter).

Each of the magnet test pieces was subjected to a shot blasting, whereby an oxide layer on a surface of each of the magnet test pieces was removed which was produced by a surface working at a preceding step. Five thousand magnet test pieces, from each of which the oxide layer was removed, were accommodated in one of two cylindrical barrels. After the vacuum-treating chamber was evacuated down to $1\times10^{-3}$ Pa or less, while rotating the rotary shaft at 1.5 rpm, the magnet test pieces were subjected to a spattering for 20 minutes under conditions of an argon (Ar) gas pressure of 1 Pa and a bias voltage of −500 V, whereby the surfaces of the magnet test pieces were cleaned. Subsequently, with a zinc ingot used under conditions of an Ar gas pressure of 0.1 Pa as a metal depositing material, a zinc deposited-film was formed on a surface of each of the magnet test pieces with a vacuum evaporation process by electron-beam heating. The vapor deposition was carried out for 1 hour in total while suppressing temperature rise of the magnets by repeating a heating operation four times. In each of the operation, the heating of the ingot was interrupted after 15 minutes had elapsed and restarted after the ingot had been left for 10 minutes. After being left for cooling, the magnet test pieces having the zinc deposited-film were evaluated about the following items.

(1) Temperature of the magnet test pieces at completion of vapor deposition (averaged value for n=10)

(2) Vickers hardness of the zinc deposited-film at completion of vapor deposition (averaged value for n=3)

(3) Thickness of the formed zinc deposited-film (averaged value for n=10)

(4) Appearance of each magnet test piece (5) The number of magnet test pieces with one or more projections having been produced with the heights exceeding a mean line of roughness curves (phase correct filtered mean line) according to JIS B0601-1994 by 100 μm or more (the number of defective pieces with projections)(n=500)

Measurement of the temperature of the magnet test pieces specified in (1) was separately carried out, rather than being carried out simultaneously with deposition of the deposited-films evaluated according to (2) to (5), under the same conditions as those for the deposition of the deposited-films. Specifically, the following way was adopted in the measurement. Shavings of a plurality of kinds of thermocrayons (manufactured by Nichiyu Giken Kogyo Co., Ltd.) representing respective specified temperatures were wrapped with a zinc foil into a package. Such a package was attached around each of the magnet test pieces, which were subjected to vapor deposition. Thereafter, it was ascertained how many degrees of temperature corresponds to the molten thermocrayon shavings. The Vickers hardness of the zinc deposited-film at completion of vapor deposition specified in (2) was measured in the same way as that described in example 1. Moreover, the number of defective pieces with projections specified in (5) was obtained by making determination in the same way as that described in example 1.

The results are shown in Table 2.

Comparative Example 2

In example 5, without carrying out the operation of heating interruption → leaving → heating restarting, the ingot was continuously heated for 1 hour for carrying out vapor deposition to form a zinc deposited-film on the surface of each of the magnet test pieces. The deposited-films were evaluated in the same way as that in example 5.

The results are shown in Table 2.

TABLE 2

| | Magnet temperature (° C.) | Vickers hardness | Film thickness (μm) | Appearance | Number of defective pieces with projections |
|---|---|---|---|---|---|
| Example 5 | 240 | 40 | 7.3 | Acceptable | 0/500 |
| Comparative Example 2 | 330 | 21 | 7.5 | A number of damages | 21/500 |

As is apparent from Table 2, in forming the zinc deposited-film on the surface of each of the magnet test pieces, by carrying out the vapor deposition with the temperature of each of the magnet test pieces maintained at $\frac{2}{3}$ or less the melting point in bulk (Tm)(° C.) of zinc, namely, 280° C. or less, the Vickers hardness of the film formed on each of the surface of the magnet test pieces could be maintained at 25 or more. Thus, no projections were produced in the film and the film itself was provided as being excellent in appearance. On the contrary, for the temperature of the magnet test pieces exceeding 280° C., a number of projections had been produced with the heights thereof exceeding 100 μm. In addition, the film itself was damaged to be unsatisfactory in appearance and corrosion resistance.

INDUSTRIAL APPLICABILITY

According to the present invention, a vapor deposition apparatus is used which comprises, in a vacuum-treating chamber, an evaporating section for a depositing material and an accommodating member or a holding member for accommodation or hold of work pieces, respectively, and, in depositing a metal depositing material on each of the surface of the work pieces with the accommodating member or the holding member being made rotated about the horizontal rotational axis thereof, vapor deposition is carried out with a Vickers hardness of a film formed on each of the surface of the work pieces maintained at 25 or more. This inhibits the metal deposited-film formed on the surface of each of the work pieces from being softened to become damageable by collisions and rubbings of the work pieces against one another and by collisions and rubbings between the work pieces and the barrel wall. As a result, production of projections in the film can be effectively inhibited.

In forming a metal deposited-film on the surface of each of the work pieces before continuously forming on the surface a film of ceramic such as $Al_2O_3$ or TiN, projections having been produced in the metal deposited-film have effect on a subsequently formed ceramic film about adhesion reliability with an adhesive and dimensional accuracy. According to the present invention, however, such adverse effects can be also avoided.

What is claimed is:

1. A method of inhibiting production of projections in a metal deposited-film characterized by using a vapor deposition apparatus comprising, in a vacuum-treating chamber, an evaporating section for a depositing material, and an accommodating member and/or a holding member for accommodation and/or hold of work pieces, respectively, and, in depositing a metal depositing material on each of the surface of said work pieces with said accommodating member and/or said holding member being made rotated about the horizontal rotational axis thereof, carrying out vapor deposition with a Vickers hardness of a film formed on each of the surface of said work pieces maintained at 25 or more.

said accommodating member and/or a holding member for accommodation and/or hold of work pieces is a tubular barrel for accommodation of said work pieces, said tubular barrel is formed of a mesh net having an open area ratio of 50 to 85%, said tubular barrel is revolvably supported circumferentially outside a horizontal rotational axis of a support member made rotatable about the rotational axis, for revolution about the rotational axis of said support member by rotating said support member, said tubular barrel revolves about the rotational axis of said support member, whereby vapor deposition is carried out under a condition that said work pieces collide with and rub against one another in said tubular barrel, a plurality of said tubular barrels are supported in an annular shape circumferentially outside the rotational axis of said support member, and said work piece is a rare earth metal-based permanent magnet.

2. A method according to claim 1 characterized in that a temperature of each of said work pieces accommodated and/or held in said accommodating member and/or said holding member, respectively, is maintained at $2/3$ or less a melting point in bulk (Tm)(° C.) of said metal depositing material to thereby maintain the Vickers hardness of said film formed on each of the surface of said work pieces at 25 or more.

3. A method according to claim 2 characterized in that said metal depositing material is aluminum, with which vapor deposition is carried out with a temperature of said work piece maintained at 350° C. or less.

4. A method according to claim 2 characterized in that said metal depositing material is zinc, with which vapor deposition is carried out with a temperature of said work piece maintained at 250° C. or less.

5. A method according to claim 1 characterized in that the vapor deposition is carried out by a vacuum evaporation process or an ion plating process.

6. A method according to claim 1 characterized in that said tubular barrel and/or said support member supporting said tubular barrel are/is detachably constituted.

* * * * *